(12) United States Patent
Naito (10) Patent No.: US 11,264,341 B2
(45) Date of Patent: Mar. 1, 2022

(54) MICROWAVE INTEGRATED CIRCUIT (71) Applicant: SUMITOMO ELECTRIC DEVICE INNOVATIONS, INC., Kanagawa (JP)

(72) Inventor: Kenshi Naito, Yokohama (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 0 days.

(21) Appl. No.: 16/815,827

(22) Filed: Mar. 11, 2020

(65) Prior Publication Data

US 2020/0294941 A1 Sep. 17, 2020

(30) Foreign Application Priority Data

Mar. 13, 2019 (JP) .............................. JP2019-045545
Mar. 13, 2019 (JP) .............................. JP2019-045547

(51) Int. Cl.
*H01L 23/49* (2006.01)
*H01L 23/52* (2006.01)
*H01L 23/66* (2006.01)
*H01L 23/498* (2006.01)
*H01L 23/522* (2006.01)

(52) U.S. Cl.
CPC ........ *H01L 23/66* (2013.01); *H01L 23/49838* (2013.01); *H01L 23/522* (2013.01); *H01L 2223/6616* (2013.01); *H01L 2223/6633* (2013.01); *H01L 2223/6683* (2013.01)

(58) Field of Classification Search
CPC ............... H01L 23/66; H01L 23/49838; H01L 23/5226; H01L 23/522; H01L 2223/6616; H01L 2223/6683; H01L 2223/6633
See application file for complete search history.

(56) References Cited

U.S. PATENT DOCUMENTS 6,774,484 B2 * 8/2004 Mimino .............. H01L 23/5226
 257/728
6,853,054 B2 * 2/2005 Baba ................... H01L 23/5222
 257/635
6,998,712 B2 * 2/2006 Okada ..................... H01L 22/32
 257/758

(Continued)

FOREIGN PATENT DOCUMENTS

| JP | 2003-309121 | 10/2003 |
| JP | 2010-205941 | 9/2010 |
| JP | 2017-085040 | 5/2017 |

*Primary Examiner* — Ida M Soward
(74) *Attorney, Agent, or Firm* — Smith, Gambrell & Russell, LLP.

(57) ABSTRACT

Provided is a microwave integrated circuit including: a semiconductor substrate; a plurality of amplification units that are formed in the semiconductor substrate; a wiring that is formed in one layer wiring excluding an uppermost layer wiring and a lowermost layer wiring among a plurality of layer wirings formed on the semiconductor substrate and is used for supplying power to the plurality of amplification units; and a plurality of vias that connect a plurality of conductive regions formed in the layer wiring with the wiring interposed therebetween and other conductive regions formed in a region interposing the wiring in the two layer wirings immediately above and immediately below the layer wiring, in which each of the plurality of vias forms a via structure connected to the conductive regions of the lowermost layer wiring by a plurality of other vias.

7 Claims, 9 Drawing Sheets

(56) References Cited

U.S. PATENT DOCUMENTS

| | | | | |
|---|---|---|---|---|
| 7,126,554 | B2* | 10/2006 | Mohamadi | H01Q 1/36 343/772 |
| 7,510,941 | B2* | 3/2009 | Hatori | H01L 21/823425 438/286 |
| 8,426,941 | B2* | 4/2013 | Sakurai | H01L 27/088 257/508 |
| 8,507,954 | B2* | 8/2013 | Cummins | H01L 27/0629 257/252 |
| 9,612,615 | B2* | 4/2017 | Lin | H01L 23/5223 |
| 10,290,632 | B2* | 5/2019 | Scott | H01L 23/535 |
| 10,431,273 | B2* | 10/2019 | Futatsuyama | H01L 27/11573 |
| 10,672,693 | B2* | 6/2020 | Ganesan | H01L 23/3107 |
| 2002/0125577 | A1* | 9/2002 | Komada | H01L 21/76813 257/774 |
| 2011/0291271 | A1 | 12/2011 | Sakai et al. | |
| 2016/0260763 | A1* | 9/2016 | Shimotsusa | H01L 27/14634 |
| 2017/0069557 | A1* | 3/2017 | Furuhata | H01L 23/528 |

* cited by examiner

MICROWAVE INTEGRATED CIRCUIT

TECHNICAL FIELD

The present disclosure relates to a microwave integrated circuit.

BACKGROUND

In the related art, microwave integrated circuits in which microwave devices are integrated have been used. As the microwave integrated circuits, Patent Literature 1 (Japanese Unexamined Patent Publication No. 2003-309121), Patent Literature 2 (Japanese Unexamined Patent Publication No. 2010-205941), or Patent Literature (Japanese Unexamined Patent Publication No. 2017-085040) discloses a multilayer monolithic microwave integrated circuit (MMIC) in which insulating layers and wiring layers are stacked on a semiconductor substrate on which circuit elements such as transistors are formed. According to the structure of such a multilayer MMIC, the reduction of the area occupied by the circuits can be implemented.

In recent years, in the microwave integrated circuit having the structure of the multilayer MMIC in the related art described above, reduction in circuit size has been demanded. However, in the microwave integrated circuit in the related art having a reduced circuit size, in some cases, oscillation between output signals occurs due to insufficient isolation between circuit units. In addition, in such a microwave integrated circuit, in order to allow the operating points of the transistors to be the same in the amplification circuit having a multi-stage configuration, in some cases, the adjustment of the bias applied to the transistors is complicated.

SUMMARY

According to one aspect of the present disclosure, there is provided a microwave integrated circuit including: a semiconductor substrate; a plurality of amplification units that are formed in the semiconductor substrate; a power supply line that is formed in one wiring layer excluding an uppermost wiring layer and a lowermost wiring layer among a plurality of wiring layers formed on the semiconductor substrate and is used for supplying power to the plurality of amplification units; and a plurality of vias that connect a plurality of conductive regions formed in the one wiring layer with the power supply line interposed therebetween and other conductive regions formed in a region interposing the power supply line in the two wiring layers immediately above and immediately below the one wiring layer, in which each of the plurality of vias forms a via structure connected to at least one of the uppermost wiring layer and the lowermost wiring layer by a plurality of other vias.

Alternatively, according to another aspect of the present disclosure, there is provided a microwave integrated circuit including: a first-stage amplifier that amplifies a input high-frequency signal having a first frequency; a main-system amplification stage that amplifies and outputs one signal having the first frequency branched from an output of the first-stage amplifier; a branch stage that generates a signal having a double frequency of the first frequency by multiplying another signal having the first frequency branched from the output of the first-stage amplifier; and a sub-system amplification stage that amplifies and outputs the signal having the double frequency output from the branch stage, in which the first-stage amplifier, the main-system amplifi-cation stage, the branch stage, and sub-system amplification stage are integrated on a common semiconductor substrate, and in which an amplification circuit constituting the first-stage amplifier, an amplification circuit included in the branch stage, an amplification circuit included in the main-system amplification stage, and an amplification circuit included in the sub-system amplification stage are connected in series between a power supply and a ground in a DC manner, and each is a current reuse type amplifier that includes two-stage transistors connected in series between a signal input and a signal output in an AC manner.

DETAILED DESCRIPTION

Hereinafter, embodiments of the present disclosure will be described with reference to the drawings. In addition, in the description of the drawings, the same components are denoted by the same reference symbols, and the redundant description is omitted.

[Configuration of Microwave Integrated Circuit]

Figure 1:
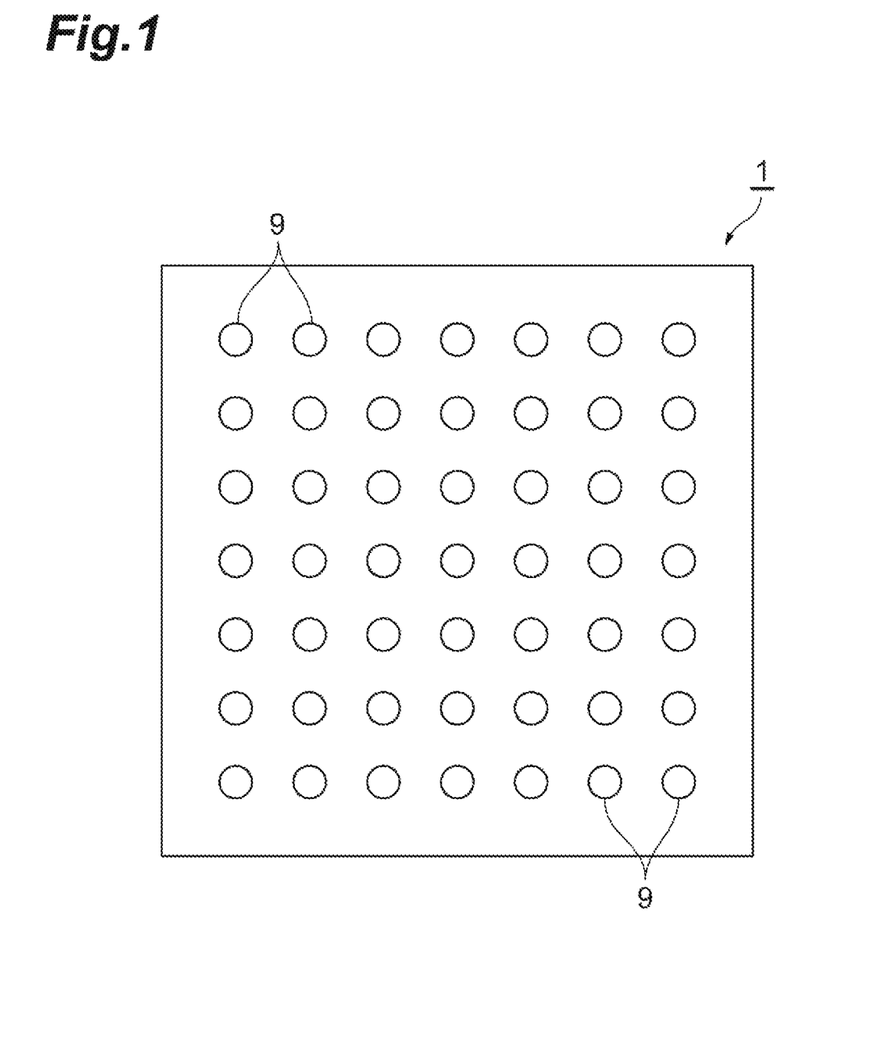
FIG. 1 is a plan view of a microwave integrated circuit 1 according to an embodiment.
Figure 2:
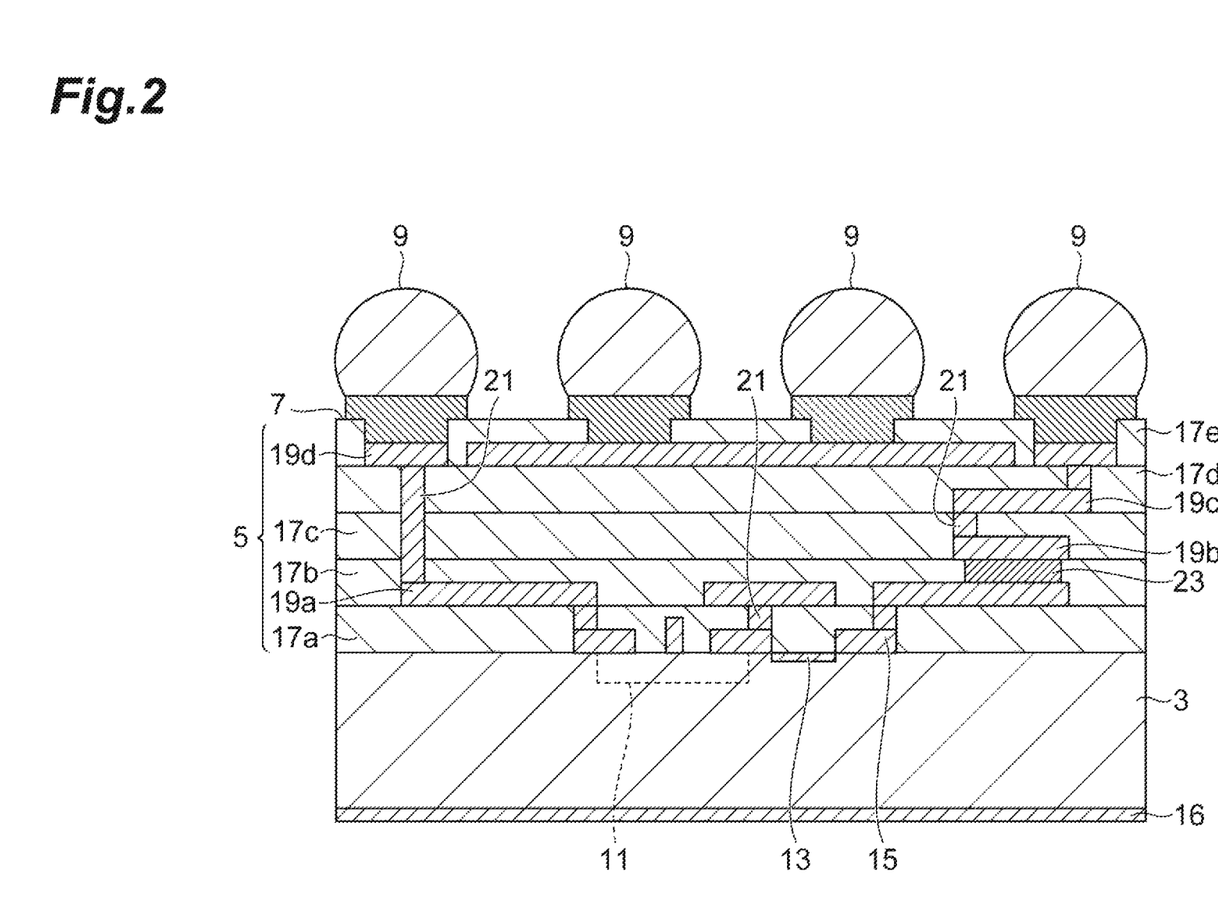
FIG. 2 is a cross-sectional view of the microwave integrated circuit 1 of FIG. 1.

FIG. 1 is a plan view of a microwave integrated circuit 1 according to an embodiment, and FIG. 2 is a cross-sectional view of the microwave integrated circuit 1. The microwave integrated circuit 1 illustrated in FIGS. 1 and 2 is an integrated circuit that amplifies and outputs a microwave signal and is a wafer level chip size package (WLCSP) chip which is an MMIC that enables flip-chip packaging in a face down manner. The microwave integrated circuit 1 includes a semiconductor substrate 3 that is a GaAs substrate in which a circuit unit including a field effect transistor (FET) or the like is formed, a multilayer wiring layer 5 stacked on the semiconductor substrate 3, and solder balls 9 formed on a surface 7 of the multilayer wiring layer 5 opposite to the semiconductor substrate 3. The semiconductor substrate 3 and the multilayer wiring layer 5 have, for example, a rectangular planar shape with a size of 2.3 mm×1.66 mm in planar view.

A conductive film 15 functioning as a terminal of each of the circuit elements such as FET 11 and the resistance element 13 formed inside the semiconductor substrate 3 is formed on the front surface of the side of the semiconductor substrate 3 closer to the multilayer wiring layer 5, a protective film 16 is formed on the back surface of the semiconductor substrate 3, and the multilayer wiring layer 5 is laminated on the front surface of the semiconductor substrate 3 on which the conductive film 15 is formed. The multilayer wiring layer 5 has a five-layer structure of a first insulating layer 17a, a second insulating layer 17b, a third insulating layer 17c, a fourth insulating layer 17d, and a fifth insulating layer 17e, a first-layer wiring 19a is formed on the surface of the first insulating layer 17a closer to the second insulating layer 17b, a second-layer wiring 19b is formed on the surface of the second insulating layer 17b closer to the third insulating layer 17c, a third-layer wiring 19c is formed on the surface of the third insulating layer 17c closer to the fourth insulating layer 17d, and a fourth-layer wiring 19d is formed on the surface of the fourth insulating layer 17d closer to the fifth insulating layer 17e.

The first insulating layer 17a is formed with two layers including a polyimide film and an SiN film on the front surface of the semiconductor substrate 3 in which the conductive films 15 corresponding to the respective electrodes of the FET 11 and the spaces between the conductive films 15 are covered with an SiN film (SiN passivation film). For example, the first insulating layer 17a is formed so that the thickness of the polyimide film is 1.4 μm and the thickness of the SiN film is 0.1 μm. The first-layer wiring 19a is formed on the front surface of the first insulating layer 17a by performing gold plating on a metal seed layer. For example, the first-layer wiring 19a is formed so that the thickness of the metal seed layer is 0.515 μm and the thickness of the gold plating is 1 μm.

The second to fourth insulating layers 17b to 17d are formed as two layers of an SiN film and a polyimide film on the first to third insulating layers 17a to 17c, respectively. For example, the second insulating layer 17b is formed with thicknesses of two layers of 0.33 μm and 2.0 μm, the third insulating layer 17c is formed with thicknesses of two layers of 0.3 μm and 2.0 μm, and the fourth insulating layer 17d is formed with thicknesses of two layers of 0.2 μm and 2.0 μm. The second to fourth-layer wirings 19b to 19d are formed by performing gold plating on the metal seed layer on the front surface of each of the second to fourth insulating layers 17b to 17d. For example, the second-layer wiring 19b and the third-layer wiring 19c are formed with a thickness of a metal seed layer of 0.205 μm and a thickness of gold plating of 1 μm, and the fourth-layer wiring 19d is formed with a thickness of a metal seed layer of 0.205 μm and a thickness of gold plating of 2 μm.

The fifth insulating layer 17e is formed with two layers including an SiN film and a polyimide film on the fourth insulating layer 17d. For example, the fifth insulating layer 17e is formed with thicknesses of two layers of 0.2 μm and 2.5 μm. A plurality of solder balls 9 which are spherical conductors electrically connected to the circuit units inside the semiconductor substrate 3 or the first to fourth-layer wirings 19a to 19d are two-dimensionally arranged and formed on the front surface of the fifth insulating layer 17e. When the microwave integrated circuit 1 is flip-chip-packaged on the mounting substrate, the solder balls 9 are electrically connected to the wirings on the mounting substrate.

In the multilayer wiring layer 5 having the above-described configuration, the solder balls 9, the conductive film 15, and the first to fourth-layer wirings 19a to 19d are electrically connected to each other by the vias 21 penetrating through at least one layer of the first to fifth insulating layers 17a to 17e. In addition, passive elements such as the capacitor 23 are formed in the multilayer wiring layer 5, for example, in the second insulating layer 17b in a state where the passive elements are connected to any one of two-layer wirings such as the first-layer wiring 19a and the second-layer wiring 19b.

Figure 3:
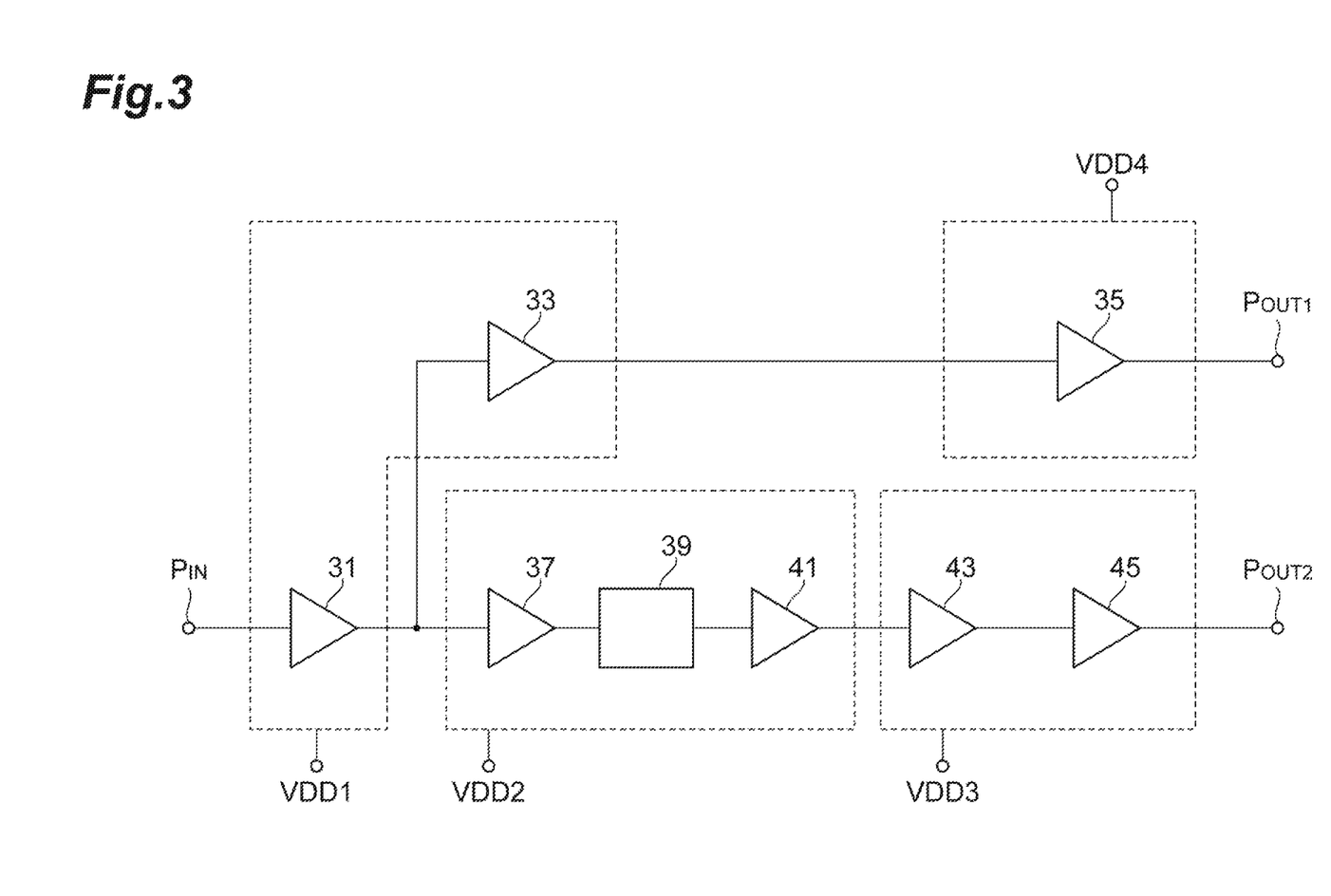
FIG. 3 is a block diagram illustrating an overall circuit configuration of the microwave integrated circuit 1 of FIG. 1.

FIG. 3 is a block diagram illustrating the overall circuit configuration in the microwave integrated circuit 1. As illustrated in FIG. 3, the microwave integrated circuit 1 is configured by integrating, on the semiconductor substrate 3, a low noise amplifier (LNA) 31 as a first-stage amplifier that amplifies the RF signal (high-frequency signal) having a first frequency (for example, a frequency of 38 GHz) input from an input terminal (signal input terminal) $P_{IN}$, a main-system amplification stage that amplifies the RF signal having the first frequency as one of the two branched RF signals after being amplified by the low noise amplifier 31, a branch stage that generates a multiplied wave (for example, an RF signal having a frequency of 77 GHz) having a double frequency of the first frequency by multiplying the RF signal having the first frequency as the other of the two branched RF signals after being amplified by the low noise amplifier 31, and a sub-system amplification stage that amplifies and outputs the multiplied wave output from the branch stage.

The main-system amplification stage has a configuration of a two-stage amplification circuit in which a driver amplifier 33 and a power amplifier 35 are connected in series, and the main-system amplification stage outputs an RF signal having a first frequency amplified to a predetermined signal strength (for example, 50 mW) from an output terminal (signal output terminal) $P_{OUT1}$. The branch stage has a configuration in which a multiplier 39 is interposed between a low noise amplifier 37 and a low noise amplifier 41 which are two-stage amplification circuits and amplifies and outputs an RF signal having a second frequency. The sub-system amplification stage has a configuration of a two-stage amplification circuit in which a driver amplifier 43 and a power amplifier 45 are connected in series, and the sub-system amplification stage is connected as the subsequent stage of the branch stage. In the branch stage, the RF signal branched from the low noise amplifier 31 is amplified by the low noise amplifier 37, the multiplier 39 multiplies the frequency of the RF signal to generate a multiplied wave (for example, an RF signal having a frequency of 77 GHz) having the second frequency, and after that, the multiplied wave is amplified by the low noise amplifier 41 again. Furthermore, the multiplied wave generated by the branch stage is sequentially amplified by the driver amplifier 43 and the power amplifier 45 of the sub-system amplification stage, and thus, the amplified wave is output from the output terminal $P_{OUT2}$ as a multiplied wave having a predetermined signal strength (for example, 30 mW).

Among the above-described circuit components, each of the amplification units including the low noise amplifier 31, the low noise amplifiers 37 and 41 included in the branch stage, the driver amplifier and the power amplifier 35 included in the main-system amplification stage, and the driver amplifier 43 and the power amplifier 45 included in the sub-system amplification stage employs a configuration of a current reuse type amplifier including two-stage FETs, as described later. On the other hand, the multiplier 39 is configured with a one-stage field effect transistor (FET) as a non-linear element, and the multiplier 39 can easily generate harmonics by performing a non-linear operation for outputting the output signal including the harmonic components from the drain due to the non-linearity of the input/output characteristics by setting the bias to be deep or shallow. Then, the multiplier 39 outputs only a predetermined multiplied wave (for example, a double-multiplied wave) from the drain output by providing limitation of the band (cutoff frequency).

Figure 4:
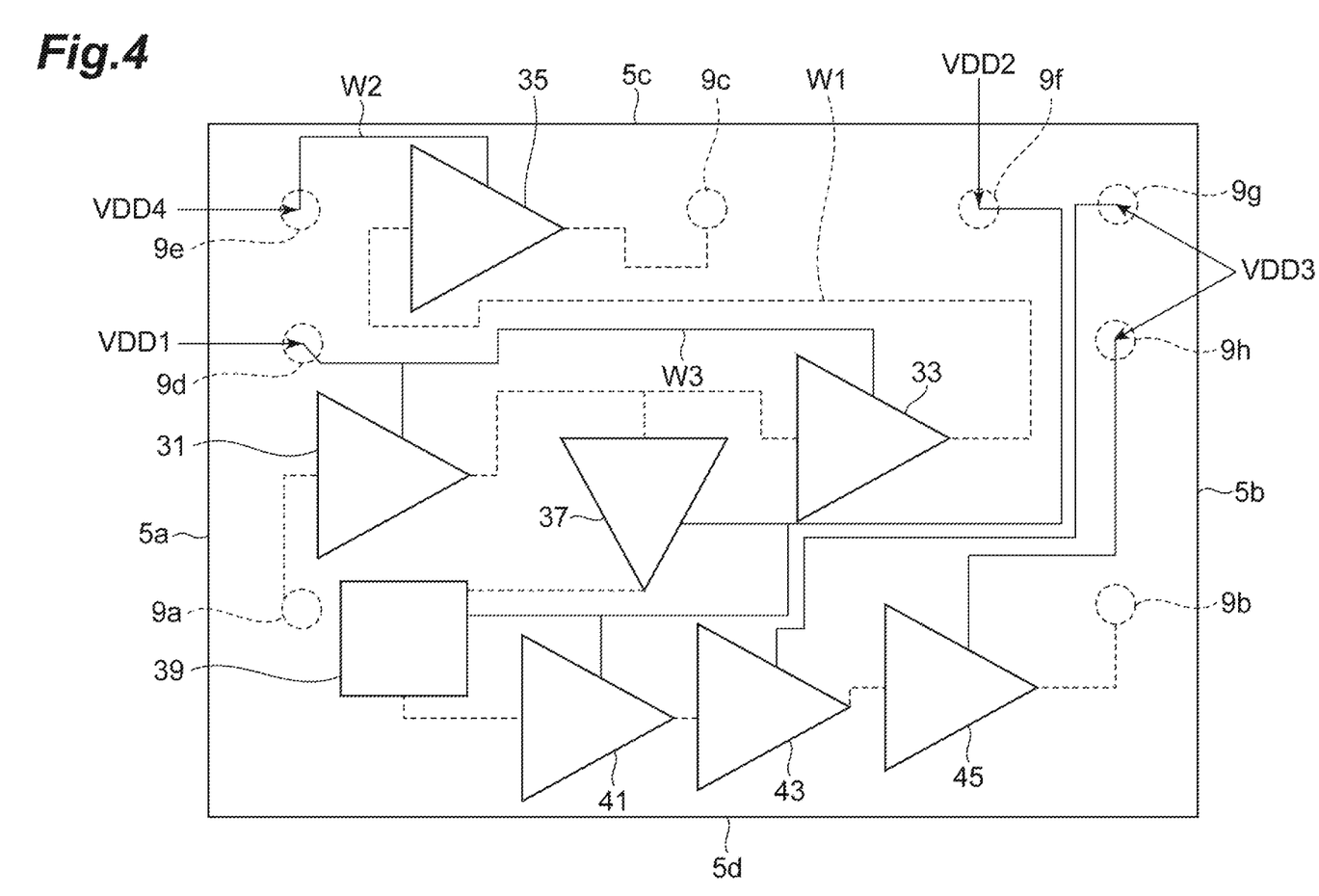
FIG. 4 is a diagram illustrating arrangement of circuit units and paths of biases applied to the circuit units and the RF signals input/output between the circuit units when viewed from the front surface side in the microwave integrated circuit 1 of FIG. 1.

FIG. 4 illustrates arrangement of the circuit units and paths of the biases applied to the circuit units and the RF signals input/output between the circuit units when viewed from the front surface side in the microwave integrated circuit 1. Herein, the paths of the biases are illustrated by solid lines, and the paths of the RF signals (including the multiplied wave) are illustrated by dotted lines. The paths of the biases are formed by the third-layer wiring 19c, and the paths of the RF signals are formed by the first-layer wiring 19a and the second-layer wiring 19b.

A solder ball 9a having a role of an input terminal $P_{IN}$ is provided on one side 5a side of the multilayer wiring layer 5 of the microwave integrated circuit 1, and in order to prevent oscillation of the output due to the coupling between the input and the output, a solder ball 9b having a role of an output terminal $P_{OUT2}$ of the sub-system amplification stage is provided on one side 5b opposite to the one side 5a of the multilayer wiring layer 5. In addition, in order to prevent oscillation of the output due to the coupling between the input and the output and the coupling with the sub-system amplification stage, a solder ball 9c having a role of an output terminal $P_{OUT1}$ of the main-system amplification stage is provided on one side 5c side of the multilayer wiring layer 5 adjacent to the one side 5a or 5b.

The arrangement of the circuit units is set corresponding to the arrangement of the solder balls 9a, 9b, and 9c as follows. The low noise amplifier 31 is arranged near the center of the one side 5a corresponding to the position of the solder ball 9a, and the multiplier 39, the low noise amplifier 41, the driver amplifier 43, and the power amplifier 45 constituting the branch stage and the sub-system amplification stage are arranged side by side between the one side 5a and the one side 5b near the one side 5d opposite to the one side 5c. On the other hand, with respect to the driver amplifier 33 and the power amplifier 35 constituting the main-system amplification stage, in order to secure an arrangement space, the driver amplifier 33 is arranged near the one side 5b from the center of the front surface, and the power amplifier 35 is arranged on the one side 5c closer to the solder ball 9c. In correspondence with the above-described arrangement, as a path of the RF signal, a wiring W1 for transmitting the RF signal along one side 5c is provided between the output of the driver amplifier 33 and the input of the power amplifier 35 in the first-layer wiring 19a.

Furthermore, the paths (power supply lines) and the solder balls 9 for supplying the biases (power) to the respective circuit units are also formed in the multilayer wiring layer 5 of the microwave integrated circuit 1. That is, a solder ball 9d for supplying a common bias (first power supply voltage) VDD1 for driving the low noise amplifier 31 and the driver amplifier 33 of the first stage of the main-system amplification stage and a solder ball 9e for supplying a bias (fourth power supply voltage) VDD4 for driving the power amplifier 35 of the last stage of the main-system amplification stage are provided to the one side 5a of the front surface of the multilayer wiring layer 5. On the third-layer wiring 19c, a wiring W2 for electrically connecting the solder ball 9e to the power amplifier 35 is formed, and a wiring W3 for electrically connecting the solder ball 9d to the low noise amplifier 31 and the driver amplifier 33 is formed. The wiring W3 is formed on the center side of the front surface of the multilayer wiring layer 5 adjacent to the wiring W1 of the RF signal between the driver amplifier 33 and the power amplifier 35. That is, the wiring W3 is formed between the position of the solder ball 9a as the input terminal $P_{IN}$ and the position of the solder ball 9c as the output terminal $P_{OUT1}$ and between the position of the low noise amplifier 31 and the position of the wiring W1. In addition, on the one side 5b side of the front surface of the multilayer wiring layer 5, a solder ball 9f for supplying a common bias (second power supply voltage) VDD2 for driving the low noise amplifier 37, the multiplier 39, and the low noise amplifier 41 included in the branch stage and solder balls 9g and 9h for supplying a common bias (third power supply voltage) VDD3 for driving the driver amplifier 43 and the power amplifier 45 of the sub-system amplification stage are provided. Wiring for electrically connecting each of the solder balls 9f, 9g, and 9h to each circuit unit is also provided in the third-layer wiring 19c.

Figure 5:
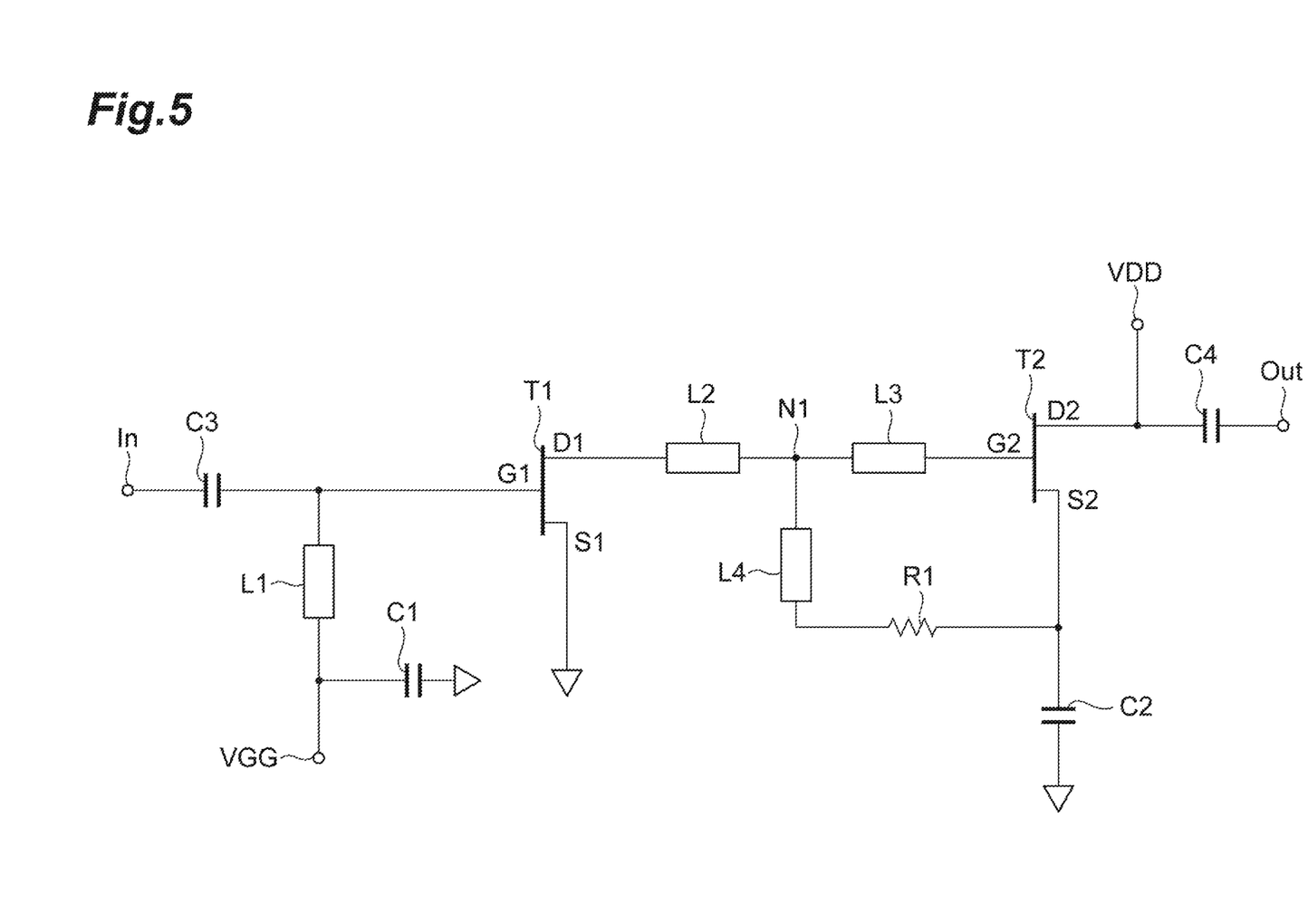
FIG. 5 is a circuit diagram illustrating a circuit configuration of amplification units configured in the microwave integrated circuit 1 of FIG. 1.

Next, a circuit configuration of the amplification units including the low noise amplifiers 31, 37, and 41, the driver amplifiers 33 and 43, and the power amplifiers 35 and 45 will be described with reference to FIG. 5. Each circuit unit is configured as a current reuse type amplifier which includes a two-stage FETs connected in series between the power supply and the ground in a DC manner and connected in series between the input of the RF signal and the output of the RF signal in an AC manner.

That is, each amplification unit includes FETs T1 and T2, transmission lines L1 to L4, capacitors C1 to C4, and a resistance element R1. In the FET T1, a gate G1 is connected in an AC manner to an input terminal. In through the capacitor C3, and a source S1 of the FET T1 is grounded. The input terminal. In is a terminal for inputting an RF signal. In addition, the gate G1 of the FET T1 is electrically connected to a power supply terminal VGG for applying a gate bias through the transmission line L1, and the power supply terminal VGG is grounded in an AC manner through the capacitor C1. In addition, a gate G2 of the FET T2 is electrically connected to a drain D1 of the FET T1 through the transmission lines L2 and L3, and a source S2 of the FET T2 is grounded in an AC manner through the capacitor C2. Furthermore, the source S2 of the FET T2 is electrically connected to a connection point N1 between the transmission line L2 and the transmission line L3 through the transmission line L4 and the resistance element R1. In addition, a drain D2 of the FET T2 is connected in an AC manner to an output terminal Out for outputting the RF signal through the capacitor C4 and is also connected to a power supply terminal VDD for applying bias. The capacitors C3 and C4 are coupling capacitors for blocking DC components.

In the amplification unit having such a configuration, the bias current flowing from the power supply terminal VDD to the FET T2 flows out from the source S2, passes through the resistance element R1 and the transmission line L4, flows into the drain D1 of the FET T1, and is discharged from the source S1 of the FET T1 to the ground. In this manner, by connecting the FET T2 and the FET T1 in series between the power supply terminal VDD and the ground in a DC manner, it is possible to implement a configuration in which the bias current supplied to the FET T2 is reused even in the FET T1.

In addition, the resistance element R1 has a role of operating the FET T2 with a self-bias. That is, the flow of the bias current in the resistance element R1 causes voltage drop, and the voltage drop results in applying the gate bias of the FET T2.

In addition, the transmission line L4 has a length of λ/4 corresponding to the wavelength λ of the RF signal (including the multiplied wave) as a target of the amplification unit. Accordingly, it is possible to prevent the path of the bias from affecting the RF signal propagating through the transmission lines L2 and L3. That is, since one end side of the transmission line L4 is grounded in an AC manner by the capacitor C2, the transmission line L4 is substantially opened in an AC manner when viewed from the connection point N1. As a result, the path of the transmission line L4 does not affect the RF signal propagating through the transmission lines L2 and L3.

Furthermore, the gate bias (fixed bias) is directly applied to the gate G1 of the FET T1 from the power supply terminal VGG. Since the transmission line L1 between the power supply terminal VGG and the gate G1 is also set to have a length of λ/4 and one end of the transmission line L1 is grounded in an AC manner, the path of the transmission line L1 does not substantially affect the RF signal propagating from the input terminal. In to the gate G1. As described above, the FET T1 and the FET T2 are connected in series in an AC manner between the input terminal. In and the output terminal Out, so that it is possible to efficiently amplify and output the RF signal.

In addition, although the amplification unit having the above-described configuration has a configuration in which the FET T1 operates with a fixed bias and the FET T2 operates with a self-bias, the FET T1 may also be allowed to operate with a self-bias by grounding the source S1 of the FET T1 with a parallel circuit of a resistance element having the same resistance value as the resistance element R1 and a capacitor and by directly grounding the gate G1 with a resistance element having a significant resistance value or a transmission line having a length of λ/4. At this time, by setting the two FETs T1 and T2 to the same size (the same gate width), the operating conditions of the two FETs become the same. As in the circuit configuration of FIG. 5, in the configuration in which one FET T1 has the fixed bias and the other FET T2 has the self-bias, by adjusting the operating point of the FET T1 by adjusting the fixed bias, it is possible to balance the distortion characteristics and the maximum output characteristics of the two-stage amplification circuit.

The size (gate width) of the FET included in each amplification unit is set to be the same, for example, as follows.
Low noise amplifier 31: 80 μm
Driver amplifier 33 (38 GHz): 240 μm
Power amplifier 35 (38 GHz): 400 μm
Driver amplifier 43 (77 GHz): 160 μm
Power amplifier 45 (77 GHz): 300 μm That is, the size ratio of the FETs included in the two amplifiers 33 and 35 constituting the main-system amplification stage is set to 3:5, the size ratio of the FETs included in the two amplifiers 43 and 45 constituting the sub-system amplification stage is set to 8:15, and the size ratio of the total size of the FETs included in the two amplifiers 33 and 35 constituting the main-system amplification stage and the total size of the FETs included in the two amplifiers 43 and 45 constituting the sub-system amplification stage is set to 32:23. Accordingly, a desired output can be obtained in a specified temperature range.

Figure 6:
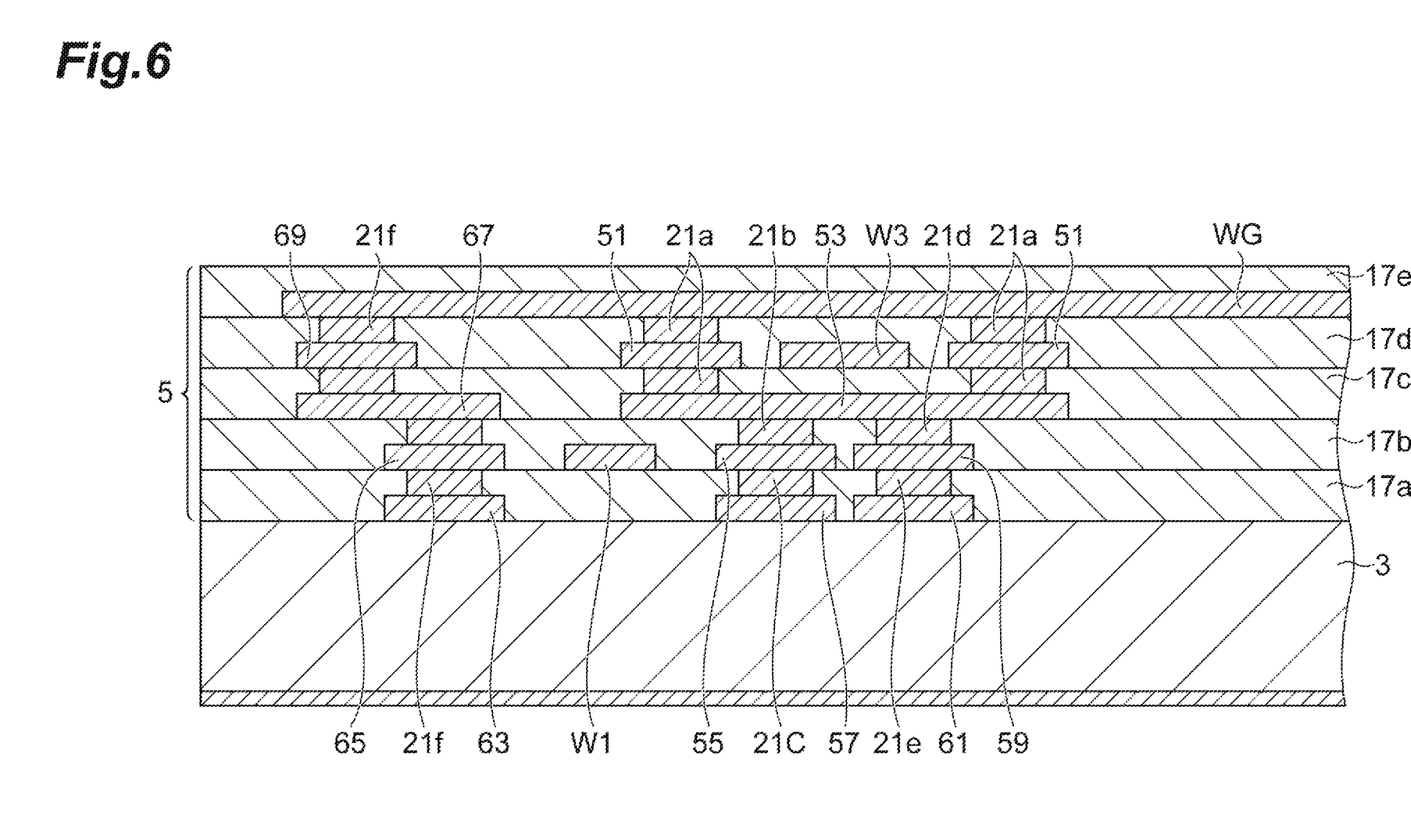
FIG. 6 is a cross-sectional view of the microwave integrated circuit 1 of FIG. 1 in the vicinity of wirings W1 and W3 in a direction perpendicular to a formation direction of the wiring W1.
Figure 7:
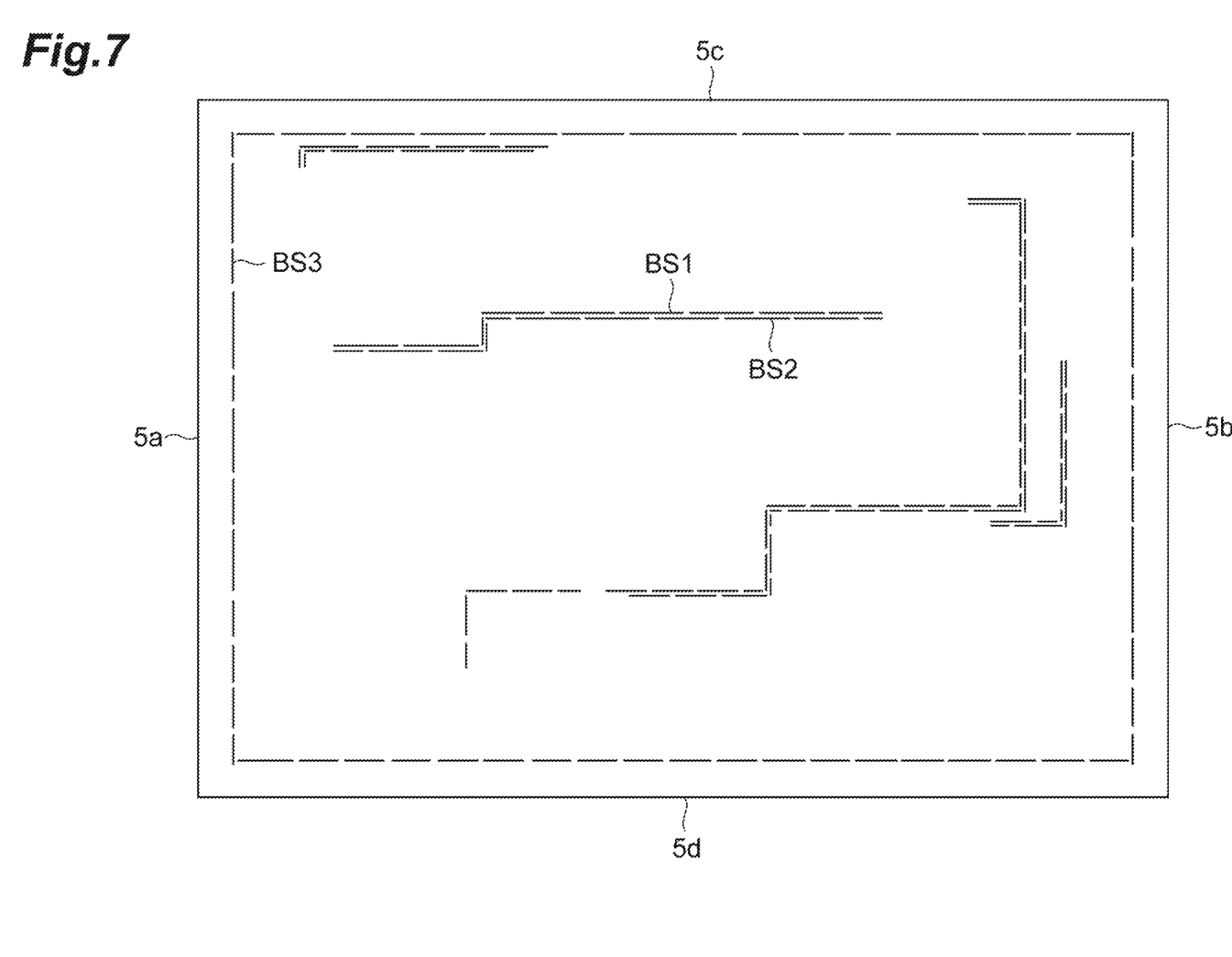
FIG. 7 is a plan view of via structures formed in the multilayer wiring layer 5.
Figure 8:
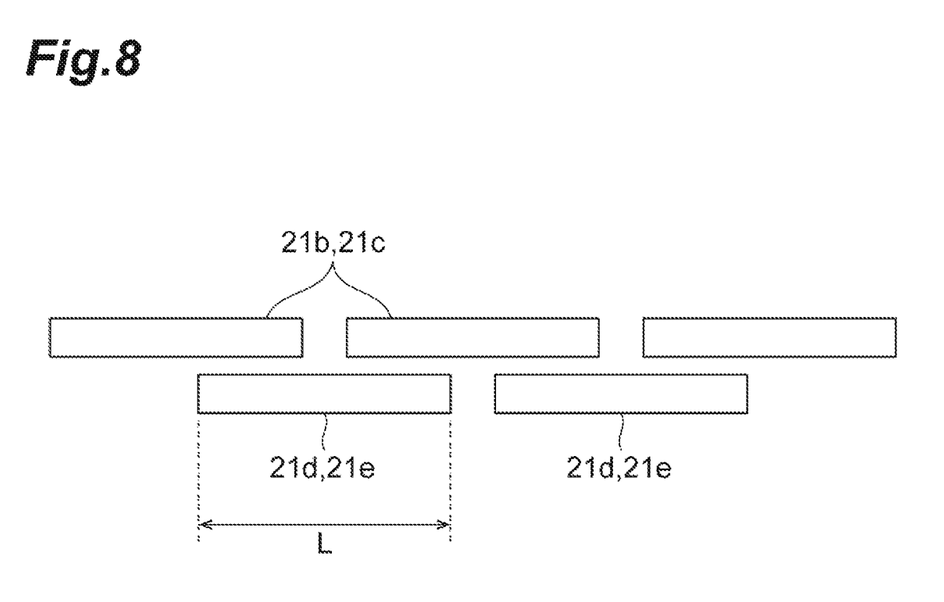
FIG. 8 is a plan view illustrating an appearance of arrangement of the via structures in FIG. 7.

Next, a via structure for signal shielding formed in the multilayer wiring layer 5 of the microwave integrated circuit 1 will be described with reference to FIGS. 6 to 8. FIG. 6 is a cross-sectional view of the microwave integrated circuit 1 in the vicinity of the wirings W1 and W3 in a direction perpendicular to the formation directions of the wirings W1 and W3, FIG. 7 is a plan view of via structures formed in the multilayer wiring layer 5, and FIG. 8 is a plan view schematically illustrating an appearance of arrangement of the via structures. In addition, in FIG. 6, the illustration of the solder balls 9 is omitted.

As illustrated in FIG. 6, the third-layer wiring 19c on the third insulating layer 17c is provided with the wiring W3 for supplying the bias, the first-layer wiring 19a on the first insulating layer 17a is provided in parallel with the wiring W1 for transmitting the RF signal, and the fourth-layer wiring 19d on the fourth insulating layer 17d is provided with a ground wiring layer WG connected to the ground through the solder ball 9. Then, a plurality of conductive regions 51 are formed on the third insulating layer 17c in parallel with the wiring W3 as the third-layer wiring 19c with the wiring W3 interposed from both sides, and a conductive region 53 is formed on the second insulating layer 17b over the region including the wiring W3 and the plurality of conductive regions 51 interposing the wiring W3. The plurality of conductive regions 51 are electrically connected to the ground wiring layer WG of the fourth-layer wiring 19d immediately above by a via 21a penetrating through the fourth insulating layer 17d formed corresponding to the planar shape of the conductive region 51 and are electrically connected to the conductive region 53 of the second-layer wiring 19b immediately below by the via 21a penetrating through the third insulating layer 17c formed corresponding to the planar shape of the conductive region 51. Since the ground wiring layer WG is formed in the range that covers the wiring W3 and the plurality of conductive regions 51, the wiring W3 is surrounded by the ground wiring layer WG, the via 21a, the conductive region 51, and the conductive region 53 from the direction perpendicular to the extending direction, and the via 21a and the conductive regions 51 and 53 are grounded through the ground wiring layer WG.

Furthermore, the following via structure is also added to the via structure formed by the via 21a and the conductive regions 51 and 53. That is, an additional via structure including a via 21b penetrating through the second insulating layer 17b, the conductive region 55 formed as the first-layer wiring 19a, a via 21c penetrating through the first insulating layer 17a, and the conductive region 57 formed on the semiconductor substrate 3 is provided between the conductive region 53 and the semiconductor substrate 3. In addition, the additional via structures are further provided. That is, an additional via structure including a via 21d penetrating through the second insulating layer 17b and being formed in parallel with the via 21b, a conductive region 59 being formed as the first-layer wiring 19a, a via 21e penetrating through the first insulating layer 17a, and a conductive region 61 being formed on the semiconductor substrate 3 is provided between the conductive region 53 and the semiconductor substrate 3. With such an additional via structure, the via structure including the via 21a is electrically connected to the conductive regions 55 and 59 on the first-layer wiring 19a and the conductive regions 57 and 61 on the semiconductor substrate 3.

A plurality of the via structures and additional via structures are provided along a plurality of wirings for supplying the biases in the multilayer wiring layer 5. In FIG. 7, the solid line indicated by the reference numeral BS1 illustrates the shape of the additional via structure formed by the vias 21b and 21c along the wiring W3, and the solid line indicated by the reference numeral BS2 in the same figure illustrates the shape of the additional via structure formed by the vias 21d and 21e along the wiring W3. Accordingly, the two additional via structures are formed in a staggered manner along the wiring W3. In addition, as illustrated in FIG. 8, in the additional via structures, the lengths of the vias 21b and 21c and the lengths of the vias 21d and 21e along the wiring W3 are set to be shorter than λ/8 corresponding to the wavelength λ of the RF signal that is to be processed by the microwave integrated circuit 1, and the arrangement intervals (gaps) of the plurality of vias 21b and 21c and the plurality of vias 21d and 21e along the wiring W3 are also set to be shorter than λ/8. In addition, the via structure including the via 21a may also be formed in similar shape and arrangement.

Returning to FIG. 6, the other via structures for electrically connecting the semiconductor substrate 3 to the uppermost fourth-layer wiring 19d are also formed in the multilayer wiring layer 5 in the vicinity of the side thereof. That is, a plurality of conductive regions 63 are formed on the semiconductor substrate 3, conductive regions 65, 67, and 69 are formed on the first to third insulating layers 17a to 17c in the shapes and ranges corresponding to the conductive regions 63, respectively, and the plurality of conductive regions 63, 65, 67, and 69 are electrically connected to the ground wiring layer WG through the plurality of vias 21f formed in the shapes and ranges corresponding to the plurality of conductive regions. A plurality of the other via structures are formed along each of the sides 5a, 5b, 5c, and 5d of the multilayer wiring layer 5 as illustrated by a solid line BS3 in FIG. 7, and the length and interval along each of the sides 5a, 5b, 5c, and 5d are set shorter than λ/8.

In the microwave integrated circuit 1 described above, the wiring W3 for supplying power to the plurality of amplification units is surrounded by the plurality of vias 21a extending over the second to fourth-layer wirings 19b to 19d and the conductive regions 53 and 51 on the second-layer wiring 19b and the third-layer wiring 19c, and the plurality of vias 21a and the conductive regions 53 and 51 are electrically connected to the ground wiring layer WG Furthermore, the via structure is connected to an additional via structure formed between the second-layer wiring 19b and the semiconductor substrate 3. With such a via structure, electrical interference between the plurality of amplification units formed on the semiconductor substrate 3 is reduced. As a result, it is possible to effectively reduce the oscillation in the output signal. Specifically, with such a via structure, it is possible to electrically shield the space between the input of the low noise amplifier 31 and the wiring W1 (input of the power amplifier 35) connecting the driver amplifier 33 and the power amplifier 35, and it is possible to reduce the oscillation in the main-system output signal. Particularly, although the solder ball 9a having a role of the input terminal $P_{IN}$ and the solder ball 9c having a role of the main-system output terminal $P_{OUT1}$ are provided on the adjacent sides 5a and 5c side (refer to FIG. 4), according to the via structures of the present embodiment, the solder balls 9a and 9c are electrically separated from each other. As a result, oscillation in the output signal can be reduced more effectively.

Particularly, the length of the via structure along the wiring is shorter than the length of λ/8 corresponding to the wavelength λ of the RF signal targeted by the microwave integrated circuit 1. According to such a configuration, it is possible to prevent a situation in which the via structure functions as an antenna to pick up the RF signal, and thus, it is possible to improve a signal shielding effect of the plurality of via structures. Furthermore, since the interval of the plurality of via structures along the wiring is also shorter than the length of λ/8, the propagation of the RF signal between the plurality of via structures is prevented, and thus, it is possible to improve the signal shielding effect of the plurality of via structures, and it is possible to more effectively reduce the oscillation in the output signal.

In addition, in the present embodiment, other via structures connecting from the front surface of the semiconductor substrate 3 to the uppermost fourth-layer wiring 19d are also formed. Accordingly, the signal shielding effect can be exhibited between the semiconductor substrate 3 and the fourth-layer wiring 19d, and thus, it is possible to further reduce the oscillation in the output signal. Particularly, since the other via structures are formed in a rectangular shape along the sides 5a, 5b, 5c, and 5d of the multilayer wiring layer 5, it is possible to prevent the propagation of the RF signal between the input terminal and the output terminal (for example, between the two solder balls 9a and 9c) passing through the outsides of the sides 5a, 5b, 5c, and 5d of the multilayer wiring layer 5.

In addition, the plurality of via structures provided in the present embodiment are arranged in a staggered manner in two columns along the wiring. Accordingly, by reducing the gap in which the signal is linearly removed by the plurality of via structures arranged side by side in parallel along the wiring, it is possible to improve the RF signal shielding effect. As a result, oscillation in the output signal can be reduced more effectively.

Figure 9:
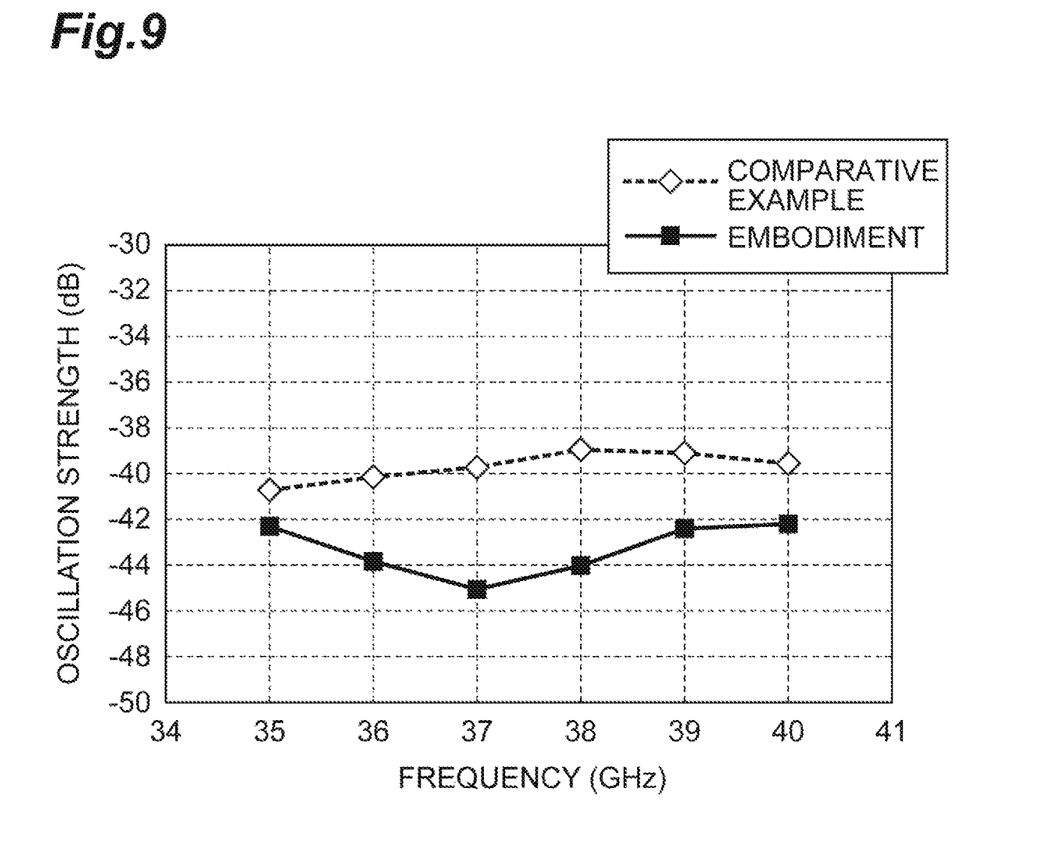
FIG. 9 is a graph showing an effect of preventing oscillation of an output signal by the microwave integrated circuit 1.

FIG. 9 is a graph showing an effect (isolation effect between terminals) of preventing the oscillation of the output signal by the microwave integrated circuit 1. Herein, the strength (isolation between the terminals) (dB) of the oscillating component observed in the case of variously changing the frequency of the RF signal processed in the main system is illustrated in comparison with Comparative Example not including the via structures. According to this result, in the microwave integrated circuit 1, the strength (isolation between terminals) of the oscillation at 38 GHz is improved by about 5 dB.

In addition, in the microwave integrated circuit 1 according to the embodiment, each amplification unit integrated on the semiconductor substrate 3 has a configuration of a current reuse type amplifier. For this reason, since the currents supplied to the two-stage FETs included in the respective amplification units become a common current, it is not necessary to adjust the biases to match the operating points of the FETs. Furthermore, even in a case where one FET constituting each amplification unit operates with a self-bias and the other FET operates with a fixed bias, it is possible to facilitate adjusting the biases.

In addition, the microwave integrated circuit 1 employs a configuration in which the biases VDD1 to VDD3 are supplied to the plurality of amplification units as a common bias. With such a configuration, it is possible to simultaneously perform bias adjustment in the plurality of amplification units in parallel. Accordingly, it is possible to further facilitate adjusting the biases.

Heretofore, while the principles of the present disclosure have been illustrated and described in preferred embodiments, it will be understood by those skilled in the art that the present disclosure can be modified in arrangement and details without departing from the principles. The present disclosure is not limited to the specific configuration disclosed in the present embodiment. Therefore, all modifications and changes derived from the scope and spirit of the claims are to be claimed.

In the above-described embodiments, although the wirings for supplying the biases in the multilayer wiring layer 5 are formed in the third-layer wiring 19c, the wirings may be formed in other wiring layers excluding the uppermost layer wiring 19d and the lowermost layer wiring 19a. In this case, the via structure surrounding the wiring is arranged corresponding to the position of the wiring.

In addition, the plurality of via structures are not necessarily electrically connected to both the uppermost layer wiring 19d and the lowermost layer wiring 19a, but the plurality of via structures may be connected to any one of the uppermost layer wiring 19d and the lowermost layer wiring 19a. Furthermore, the ground wiring layer WG is not necessarily formed on the uppermost layer wiring 19d, but for example, the ground wiring layer WG may be formed on the lowermost layer wiring 19a. In this case, the plurality of via structures (also including other via structures) are formed by being electrically connected to the ground wiring layer WG of the lowermost layer wiring 19a.

What is claimed is:

1. A microwave integrated circuit, comprising:
   a semiconductor substrate;
   a plurality of amplification units formed in the semiconductor substrate;
   a power supply line formed in one wiring layer excluding an uppermost wiring layer and a lowermost wiring layer among a plurality of wiring layers formed on the semiconductor substrate, the power supply line supplying power to the plurality of amplification units; and
   a plurality of vias connecting a plurality of conductive regions formed in the one wiring layer with the power supply line interposed therebetween and other conductive regions formed in a region interposing the power supply line in two wiring layers that are immediately above and immediately below the one wiring layer,
   wherein each via of the plurality of vias forms a via structure connected to at least one of the uppermost wiring layer and the lowermost wiring layer by a plurality of other vias.

2. The microwave integrated circuit according to claim 1, wherein a length of each via of the plurality of vias along the power supply line is shorter than a length of $\lambda/8$ corresponding to a signal wavelength $\lambda$ targeted by the microwave integrated circuit.

3. The microwave integrated circuit according to claim 1, wherein an interval of the plurality of vias along the power supply line is shorter than a length of $\lambda/8$ corresponding to a signal wavelength $\lambda$ targeted by the microwave integrated circuit.

4. The microwave integrated circuit according to claim 1, wherein the vias of the plurality of vias are grounded through the uppermost wiring layer or the lowermost wiring layer.

5. The microwave integrated circuit according to claim 1,
   wherein the semiconductor substrate has a planar shape of a rectangle and has a signal input terminal on one side of the rectangle and a signal output terminal on another side adjacent to the one side, and
   wherein the signal input terminal and the signal output terminal are electrically separated by the via structure.

6. The microwave integrated circuit according to claim 1, further comprising a plurality of other vias penetrating through the plurality of wiring layers and connecting the semiconductor substrate and the uppermost wiring layer.

7. The microwave integrated circuit according to claim 6, wherein
   the via structure further includes a plurality of additional vias formed along the plurality of other vias, and
   the plurality of other vias and the plurality of additional vias are arranged in a staggered manner with respect to each other.

* * * * *